United States Patent
Lin

(10) Patent No.: US 8,908,363 B2
(45) Date of Patent: Dec. 9, 2014

(54) DISPLAY HAVING PIVOT CONSTRAINT FUNCTION

(71) Applicant: Wistron Corporation, New Taipei (TW)

(72) Inventor: Wei-Hsin Lin, New Taipei (TW)

(73) Assignee: Wistron Corporation, Hsichih, New Taipei (TW)

( * ) Notice: Subject to any disclaimer, the term of this patent is extended or adjusted under 35 U.S.C. 154(b) by 188 days.

(21) Appl. No.: 13/757,842

(22) Filed: Feb. 3, 2013

(65) Prior Publication Data

US 2013/0271901 A1 Oct. 17, 2013

(30) Foreign Application Priority Data

Apr. 17, 2012 (TW) .............................. 101113577 A

(51) Int. Cl.
*G06F 1/16* (2006.01)
*H05K 5/02* (2006.01)

(52) U.S. Cl.
CPC .................................... *H05K 5/0226* (2013.01)
USPC ..................................................... 361/679.21

(58) Field of Classification Search
USPC ..................................................... 361/679.21
See application file for complete search history.

(56) References Cited

U.S. PATENT DOCUMENTS

| | | | | |
|---|---|---|---|---|
| 7,193,843 B2* | 3/2007 | Hsu | ........................... | 361/679.21 |
| 7,636,133 B1* | 12/2009 | Hsu | ............................... | 348/794 |
| 7,637,463 B2* | 12/2009 | Yen et al. | ....................... | 248/157 |
| 7,698,784 B2 | 4/2010 | Hsu | | |
| 7,708,243 B2* | 5/2010 | Wang et al. | ..................... | 248/157 |
| 7,766,297 B2* | 8/2010 | Chih | .......................... | 248/349.1 |
| 7,922,133 B2* | 4/2011 | Hsu | .............................. | 248/127 |
| 7,926,778 B2* | 4/2011 | Yen et al. | ....................... | 248/371 |
| 7,975,975 B2* | 7/2011 | Lee | ............................. | 248/278.1 |
| 8,020,821 B2* | 9/2011 | Chen et al. | ................ | 248/220.22 |
| 8,047,488 B2* | 11/2011 | Wang et al. | ................. | 248/291.1 |
| 8,087,628 B2* | 1/2012 | Chen et al. | ................ | 248/231.41 |
| 8,245,990 B2* | 8/2012 | Huang | ........................ | 248/276.1 |
| 8,498,101 B2* | 7/2013 | Chiang et al. | .............. | 361/679.22 |
| 8,537,122 B2* | 9/2013 | Geiger | .......................... | 345/173 |
| 8,582,283 B2* | 11/2013 | Chen et al. | ............... | 361/679.21 |
| 8,593,797 B2* | 11/2013 | Chien et al. | ............... | 361/679.21 |
| 8,625,265 B2* | 1/2014 | Chen et al. | ............... | 361/679.21 |
| 8,628,051 B2* | 1/2014 | Huang | ........................ | 248/286.1 |
| 8,746,635 B2* | 6/2014 | Kim et al. | ..................... | 248/133 |
| 8,830,669 B2* | 9/2014 | Sakamoto | ............... | 361/679.22 |
| 2005/0002159 A1* | 1/2005 | Jeong | ............................. | 361/683 |
| 2007/0097617 A1* | 5/2007 | Searby et al. | ................. | 361/686 |
| 2009/0225504 A1* | 9/2009 | Wu | .......................... | 361/679.21 |

* cited by examiner

*Primary Examiner* — Lisa Lea Edmonds

(74) *Attorney, Agent, or Firm* — Winston Hsu; Scott Margo

(57) ABSTRACT

A display having pivot constraint function is disclosed in the present invention. The display includes a panel, a supporter, a pivot mechanism and a constraint mechanism. The pivot mechanism is disposed between a first bridging component of the panel and a second bridging component of the supporter. A rotation angle of the panel relative to the supporter can be adjusted via the pivot mechanism, and the constraint mechanism can constrain the rotation of the panel relative to the supporter. The constraint mechanism includes a body and a contacting portion. The body is movably disposed on the panel, and partly protrudes from a boundary of the panel. The contacting portion is connected to the body for simultaneously contacting the first bridging component and the second bridging component, so as to constrain rotation between the first bridging component and the second bridging component, and to fix a view angle of the panel.

20 Claims, 8 Drawing Sheets

DISPLAY HAVING PIVOT CONSTRAINT FUNCTION

BACKGROUND OF THE INVENTION

1. Field of the Invention

The present invention relates to a display, and more particularly, to a display capable of constraining its pivot angle for easy adjustment and steady immovability.

2. Description of the Prior Art

With the advanced technology, the display of the electronic device trends a large-scaled for comfortable entertainment enjoyment. The display is disposed on the supporter via a pivot mechanism. The user can rotate the display according to a position of the electronic device, to adjust a pivot angle of the display relative to the supporter for a preferred view angle. The pivot mechanism utilizes friction to generate force for supporting the display, so as to fix the pivot angle of the display relative to the supporter. However, the display of the conventional electronic device has huge volume, and a weight of the display is heavy accordingly. In order to overcome the weight of the display with the huge volume, friction of the pivot mechanism is increased for supporting the large-scaled display. Then, the user exerts violent force to adjust the rotation of the display. Operation of the conventional electronic device is inconvenient.

In addition, the display is usually matched with the touch screen interface for better entertainment of the product. Torsional friction of the conventional pivot mechanism is increased to support the large-scaled display. When the user clicks the display, the conventional pivot mechanism is ineffective easily, and the display may shake or sway. A conventional solution utilizes a lock mechanism to constrain the rotation of the pivot mechanism, so as to overcome a drawback of insufficient supporting force. By the conventional solution, the user releases constraint of the lock mechanism, then manually pushes the display for adjusting its view angle, and finally relocks the lock mechanism to finish operation. The operation of the conventional solution is complicated, a releasing step and a relocking step are necessary during the rotation of the display. Therefore, design of a pivot constraint mechanism with easy structure and convenient operation is an important issue in the mechanical industry.

SUMMARY OF THE INVENTION

The present invention provides a display capable of constraining its pivot angle for easy adjustment and steady immovability for solving above drawbacks.

According to the claimed invention, a display includes a panel, a supporter, a pivot mechanism and a constraint mechanism. The panel includes a first bridging component. The supporter includes a second bridging component. The pivot mechanism is disposed between the first bridging component and the second bridging component. A rotation angle of the panel relative to the supporter is adjusted via the pivot mechanism. The constraint mechanism is for constraining rotation of the panel relative to the supporter. The constraint mechanism includes a body and a contacting portion. The body is movably disposed on a position of the panel adjacent to the pivot mechanism. The body partly protrudes from a boundary of the panel along a first direction. The contacting portion is connected to the body. The contacting portion simultaneously contacts the first bridging component and the second bridging component, so as to constrain rotation between the first bridging component and the second bridging component.

According to the claimed invention, the body partly protrudes from a low boundary of the panel along the first direction.

According to the claimed invention, the body is a T-shaped structure, and two ends of the T-shaped structure respectively protrude from two lateral edges of the panel along a second direction different from the first direction.

According to the claimed invention, the body is slidably disposed on the panel, or is rotatably disposed on the panel.

According to the claimed invention, the constraint mechanism further includes a plurality of friction gaskets disposed on the contacting portion for contacting surfaces of the first bridging component and the second bridging component, so as to increase static friction between contacting portion, the first bridging component and the second bridging component.

According to the claimed invention, the first bridging component includes a first engaging portion, the second bridging component includes a second engaging portion, and the contacting portion includes a third engaging portion. The third engaging portion is engaged with the first engaging portion and the second engaging portion simultaneously, so as to constrain the rotation between the first bridging component and the second bridging component.

According to the claimed invention, the first engaging portion is a sunken structure, the second engaging portion is a dentate structure, the third engaging portion is a protrusion, and the protrusion is engaged inside the sunken structure and a groove of the dentate structure.

According to the claimed invention, the first engaging portion, the second engaging portion and the third engaging portion are elements with high friction coefficient. The three engaging portions contact to each other for providing greater resistance, so as to constrain movements between the three engaging portions.

According to the claimed invention, the first engaging portion is a protrusion, the second engaging portion is a dentate structure, the third engaging portion is a sunken structure, and the sunken structure is engaged with the protrusion and a rack of the dentate structure.

According to the claimed invention, the constraint mechanism further includes a resilient component. Two ends of the resilient component are respectively connected to the body and the panel, so as to drive the contacting portion to contact the first bridging component and the second bridging component.

According to the claimed invention, an axial direction of the resilient component is substantially parallel to the first direction.

According to the claimed invention, an axial direction of the resilient component is substantially parallel to a plane normal vector of the panel.

According to the claimed invention, the resilient component is an extended spring.

According to the claimed invention, an electronic device includes a panel, a supporter, a pivot mechanism and a constraint mechanism. The panel includes a first bridging component. The supporter includes a second bridging component. At least one electronic component is disposed inside the supporter. The pivot mechanism is disposed between the first bridging component and the second bridging component. A rotation angle of the panel relative to the supporter is adjusted via the pivot mechanism. The constraint mechanism is for constraining rotation of the panel relative to the supporter. The constraint mechanism includes a body and a contacting portion. The body is movably disposed on a position of the panel adjacent to the pivot mechanism. The body partly protrudes from a boundary of the panel along a first direction.

The contacting portion is connected to the body. The contacting portion simultaneously contacts the first bridging component and the second bridging component, so as to constrain rotation between the first bridging component and the second bridging component.

The display of the present invention utilizes the constraint mechanism to unlock the pivot mechanism, so as to steady the view angle of the panel relative to the supporter. The constraint mechanism of the present invention is actuated with the adjustment of the view angle of the panel, so as to decrease operation steps for economizing adjustment period of the display effectively. It is to say, the present invention can be preferably applied to the large-scaled display. The large-scaled display includes the pivot mechanism with necessary torque, and the constraint mechanism for constraining the pivot mechanism accordingly. When adjusting the view angle of the display, the constraint mechanism can be unlocked, and the panel can be rotated via the pivot mechanism simultaneously. After the external force applied to the panel is released, the constraint mechanism can lock the pivot mechanism immediately. Therefore, the present invention can actuate the pivot mechanism and the constraint mechanism of the display without extra steps (such as independent steps to lock and to unlock the pivot mechanism by the constraint mechanism), and provides convenient adjustment and effective immovability for the panel.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
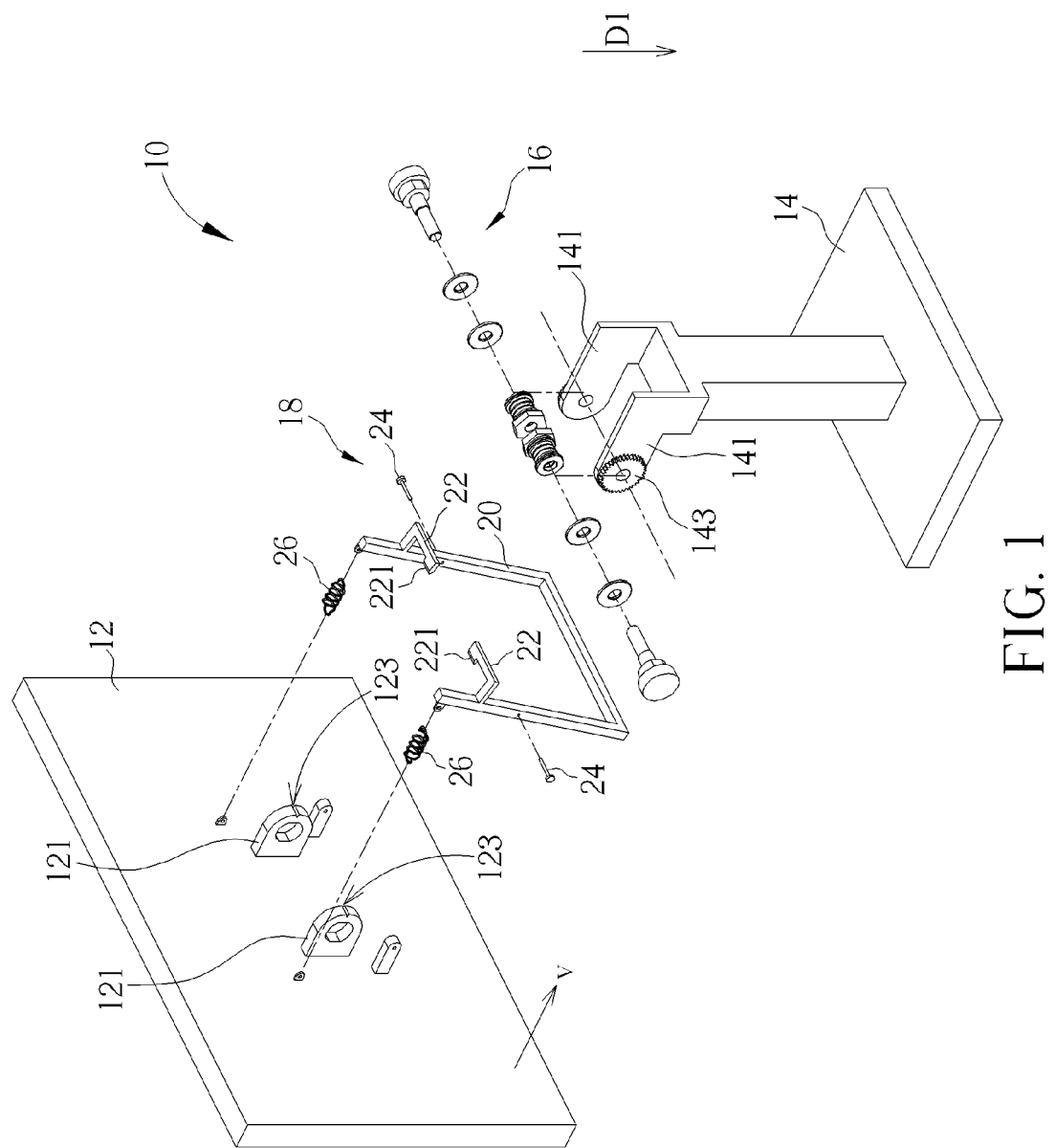
FIG. 1 is an exploded diagram of a display according to a first embodiment of the present invention.

Please refer to FIG. 1. FIG. 1 is an exploded diagram of a display 10 according to a first embodiment of the present invention. The display 10 can be a displaying screen, a touch screen or an All-in-one computer. The display 10 has a function to constrain its panel rotation. As shown in FIG. 1, the display 10 includes a panel 12, a supporter 14, a pivot mechanism 16 and a constraint mechanism 18. The panel 12 can be a display screen or a board holder. A view angle of the display screen can be adjusted and fixed at any position. The board holder can be utilized to hold an object for performance.

The panel 12 and the supporter 14 can respectively include two first bridging components 121 and two second bridging components 141 for connecting to the pivot mechanism 16. The pivot mechanism 16 is disposed between the first bridging component 121 and the second bridging component 141. A rotation angle of the panel 12 relative to the supporter 14 can be adjusted via the pivot mechanism 16. For fixing the view angle of the panel 12, the constraint mechanism 18 can constrain function of the pivot mechanism 16, which means the constraint mechanism 18 can constrain rotation of the panel 12 relative to the supporter 14. Therefore, the constraint mechanism 18 can be utilized to lock and to unlock a view angle adjustment of the display 10 of the present invention.

The pivot mechanism 16 of the present invention can be a double pivot mechanism, a coaxial pivot mechanism, an alloy pivot mechanism or a resilient pivot mechanism, alternatively. Selection of the pivot mechanism 16 depends on dimensions and weight of the panel 12. The pivot mechanism 16 utilizes friction to generate resistance, so as to steady the rotation angle of the panel 12 relative to the supporter 14. Shape of the pivot mechanism 16 is not limited to the above-mentioned embodiment, and depends on actual demand.

The constraint mechanism 18 includes a body 20 and two contacting portions 22. The contacting portions 22 are respectively connected to two ends of the body 20. The constraint mechanism 18 can utilize two axles 24 to pivot the body 20 to the panel 12 in a rotatable manner. A position of the body 20 on the panel 12 is adjacent to the pivot mechanism 16. The constraint mechanism 18 can further include at least one resilient component 26. Two ends of the resilient component 26 can be respectively connected to the body 20 and the panel 12. The resilient component 26 can drive the contacting portions 22 to simultaneously contact the corresponding first bridging component 121 and the corresponding second bridging component 141.

It should be mentioned that the body 20 can protrude from a boundary of the panel 12 along a first direction D1. For example, the body 20 can protrude from a low boundary of the panel 12 by ergonomics. An axial direction of the resilient component 26 can be substantially parallel to a plane normal vector V of the panel 12. Thus, a resilient recovering force of the resilient component 26 can drive the contacting portions 22 to simultaneously contact against the first bridging component 121 and the second bridging component 141, so as to lock the function of the pivot mechanism 16. The panel 12 can not rotate relative to the supporter 14, and the view angle of the panel 12 can be fixed stably. The resilient component 26 can be an extended spring.

On the other way, the constraint mechanism 18 can replace the resilient component 26 by a torsional spring. The torsional spring can sheathe on the corresponding axle 24, and the body 20 can be rotated by a resilient recovering force of the torsional spring, so that the contacting portions 22 can simultaneously contact against the first bridging component 121 and the second bridging component 141, to constrain rotation between the first bridging component 121 and the second bridging component 141, and further to steady the view angle of the panel 12. Elements capable of pivoting the body 20 relative to the panel 12 via the axle 24 for contacting the contacting portion 22 against the first bridging component 121 and the second bridging component 141 automatically belong to design scope of the resilient component 26 of the present invention, and detailed description are omitted herein for simplicity.

As shown in FIG. 1, each first bridging component 121 can include a first engaging portion 123, each second bridging component 141 can include a second engaging portion 143, and each contacting portion 22 can includes a third engaging portion 221. When the third engaging portion 221 is simultaneously engaged with the first engaging portion 123 and the second engaging portion 143, the first bridging component 121 can not rotate relative to the second bridging component 141. For example, the third engaging portion 221 can be a protrusion, the second engaging portion 143 can be a dentate structure, and the first engaging portion 123 can be a sunken structure. For locking the view angle of the panel 12, the protrusion can be engaged inside the sunken structure and a groove of the dentate structure. Therefore, rotation of the first bridging component 121 relative to the second bridging component 141 via the pivot mechanism 16 is ineffective, and the view angle of the panel 12 can be steady.

For example, the second engaging portion 143 (the dentate structure) includes a series of grooves and racks with uniform arrangement. Each groove is disposed between two adjacent racks (each rack is disposed two adjacent grooves) to form a saw-toothed structure. A height difference between a bottom of the groove and a top of the rack can substantially equal dimensions of a front of the third engaging portion 221. As the third engaging portion 221 is the protrusion, the front of the third engaging portion 221 can insert into the groove (the second engaging portion 143) and the first engaging portion 123 to generate an interference, so as to constrain the rotation between the first bridging component 121 and the second bridging component 141. Furthermore, when the third engaging portion 221 is the sunken structure, the first engaging portion 123 and the rack of the second engaging portion 143 can be simultaneously engaged inside the sunken structure of the third engaging portion 221, and the interference can be generated to constrain the rotation between the first bridging component 121 and the second bridging component 141.

Besides, when the second engaging portion 143 is the dentate structure, the first engaging portion 123 can be the protrusion, and the third engaging portion 221 can be the corresponding sunken structure. The sunken structure can be engaged with the protrusion and the rack of the dentate structure, so as to constrain the rotation between the first bridging component 121 and the second bridging component 141. Therefore, structural shapes of the first engaging portion 123, the second engaging portion 143 and the third engaging portion 221 are not limited to the above-mentioned embodiment. Elements with detachable function belong to the design scopes of the first engaging portion 123, the second engaging portion 143 and the third engaging portion 221 of the present invention, and detailed description are omitted herein for simplicity.

The first engaging portion 123, the second engaging portion 143 and the third engaging portion 221 can further be elements having high friction coefficient. When the display 10 utilizes the constraint mechanism 18 to lock the rotation, the resilient component 26 drives the body 20 to press the third engaging portion 221 on the first engaging portion 123 and the second engaging portion 143. Due to the high friction coefficient between the three engaging portions, the rotation of the panel 12 relative to the supporter 14 can be constrained effectively. Elements utilizing the friction to constrain the rotation between the first bridging component 121 and the second bridging component 141 belong to the design scope of the constraint mechanism 18 of the present invention, and detailed description are omitted herein for simplicity.

Figure 2:
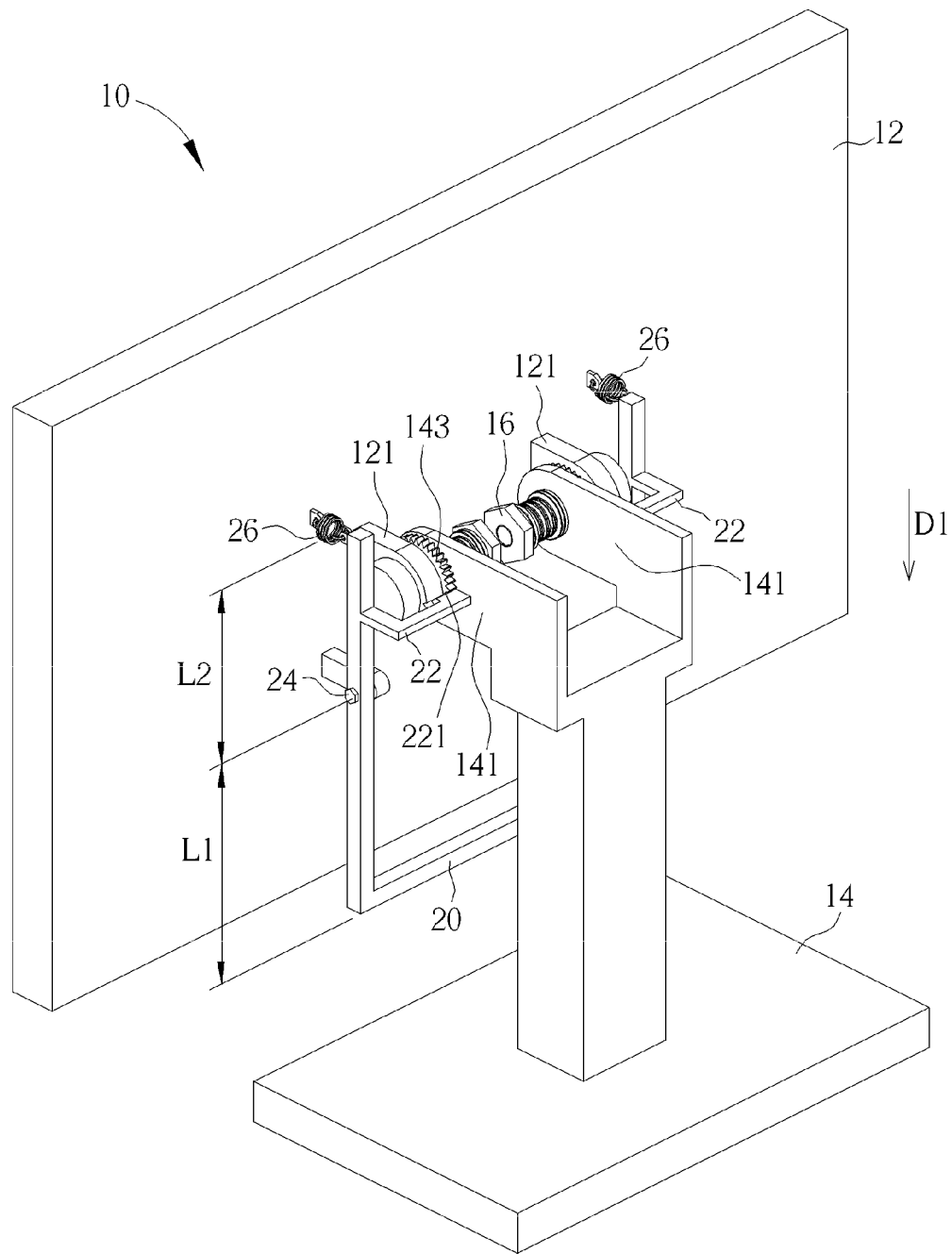
FIG. 2 and FIG. 3 respectively are diagrams of the display in different operating modes according to the first embodiment of the present invention.
Figure 3:
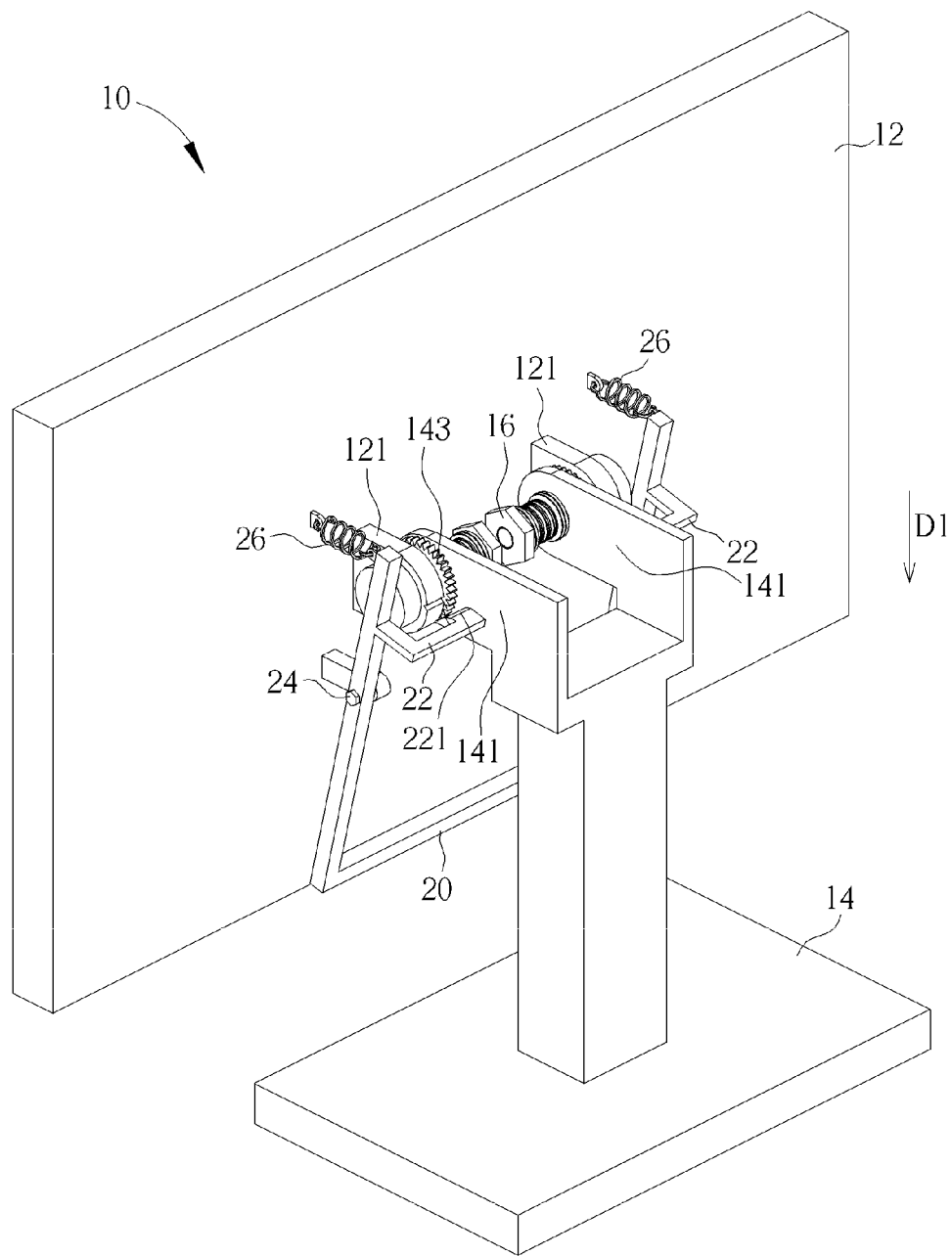

Please refer to FIG. 2 and FIG. 3. FIG. 2 and FIG. 3 respectively are diagrams of the display 10 in different operating modes according to the first embodiment of the present invention. As shown in FIG. 2, the display 10 is at an initial state. The third engaging portion 221 of the contacting portion 22 can contact the first engaging portion 123 and the second engaging portion 143 by the resilient component 26, so as to luck the function of the pivot mechanism 16. The panel 12 can not rotate relative to the supporter 14 due to the constraint mechanism 18. For adjusting the view angle of the panel 12, the low boundary of the panel 12 can be pushed to rotate the panel 12, and meantime a part of the body 20 (the part can be named as the pressing portion) which protrudes from the low boundary of the panel 12 can be pressed, so as to unlock the constraint mechanism 18.

As shown in FIG. 3, the body 20 can rotate through the axle 24 by an external force. The resilient component 26 can be extended by the rotating body 20, the third engaging portion 221 of the contacting portion 22 is separated from the first engaging portion 123 and the second engaging portion 143, and the constraint mechanism 18 is unlocked. Then, the rotation angle of the panel 12 relative to the supporter 14 can be adjusted via the pivot mechanism 16. When the panel 12 is adjusted at a predetermined angle, the external force applied to the body 20 (the pressing portion) can be released, so the resilient recovering force of the resilient component 26 can rotate the body 20 in reverse. The third engaging portion 221 of the contacting portion 22 can be engaged with the first engaging portion 123 and the second engaging portion 143, and the display 10 backs to the initial state. The constraint mechanism 18 can be started to stably steady the view angle of the panel 12.

A first distance L1 between the pressing portion and the axle 24 can be substantially greater than a second distance L2 between the axle 24 and the resilient component 26, so that the body 20 can rotate easily to overcome the resilient recovering force of the resilient component 26 by a economic effort, so as to separate the third engaging portion 221 of the contacting portion 22 from the first engaging portion 123 and the second engaging portion 143.

Figure 4:
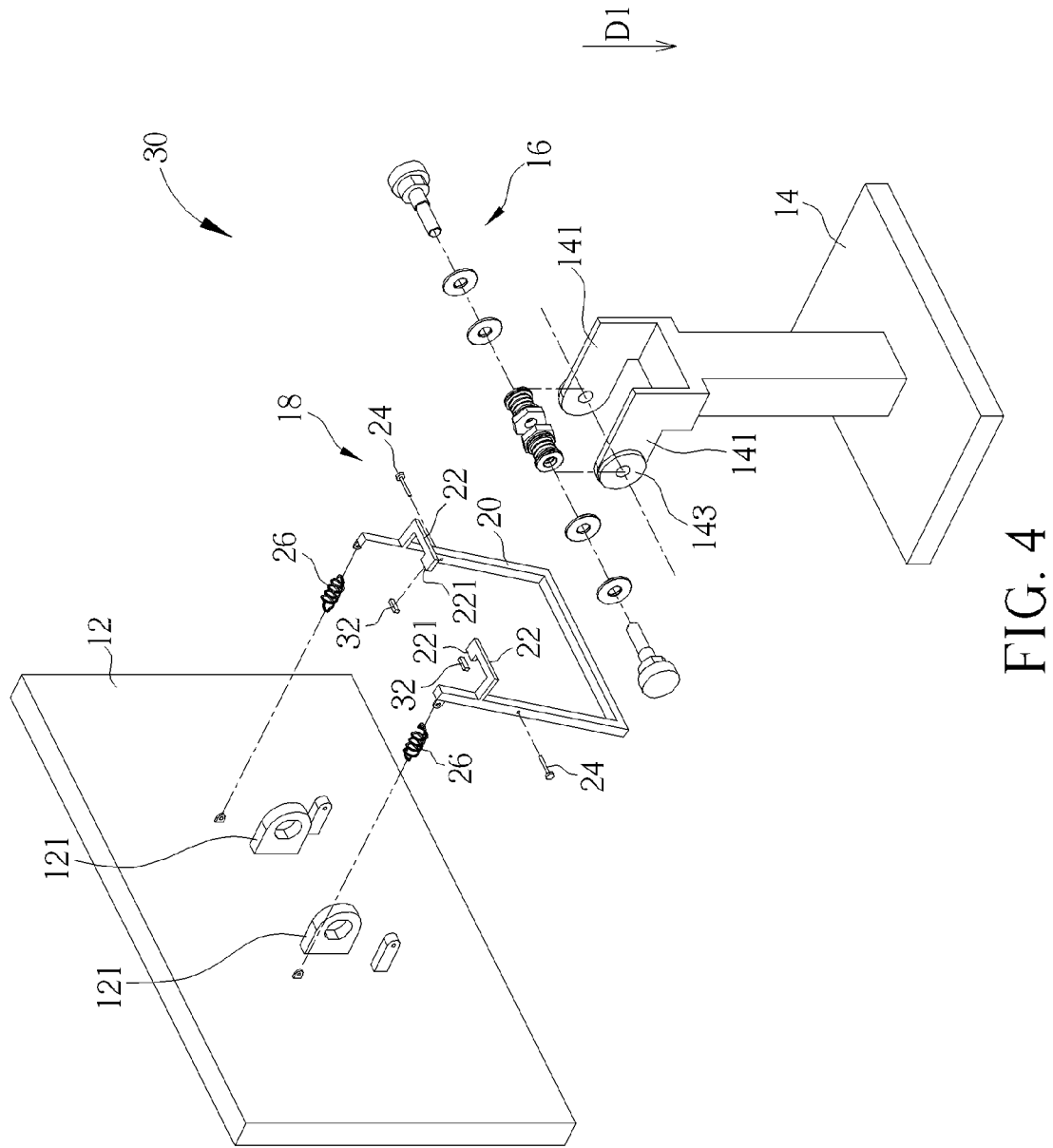
FIG. 4 is an exploded diagram of a display according to a second embodiment of the present invention.

The constraint mechanism 18 of the present invention can further utilize the friction to constrain the rotation between the first bridging component 121 and the second bridging component 141. Please refer to FIG. 4. FIG. 4 is an exploded diagram of a display 30 according to a second embodiment of the present invention. In the second embodiment, elements having the same numerals as ones of the first embodiment have the same structures and functions, and detailed description is omitted herein for simplicity. Difference between the first embodiment and the second embodiment is that the constraint mechanism 18 of the second embodiment can further include a plurality of friction gaskets 32. The plurality of friction gaskets 32 is disposed on surfaces of the contacting portions 22 for contacting the first bridging component 121 and the second bridging component 141.

The first bridging component 121, the second bridging component 141 and the contacting portion 22 of the second embodiment have smooth surfaces. The friction gasket 32 disposed on the contacting portion 22 can increase static friction between the first bridging component 121, the second bridging component 141 and the contacting portion 22. When the contacting portion 22 tightly contacts the first bridging component 121 and the second bridging component 141 via the friction gaskets 32 and the resilient component 26, a value of the static friction can be designed as being substantially greater than resultant on the supporter 14 that is applied by a weight of the panel 12 via the pivot mechanism 16, so as to prevent the panel 12 from shaking or swaying effectively.

Figure 5:
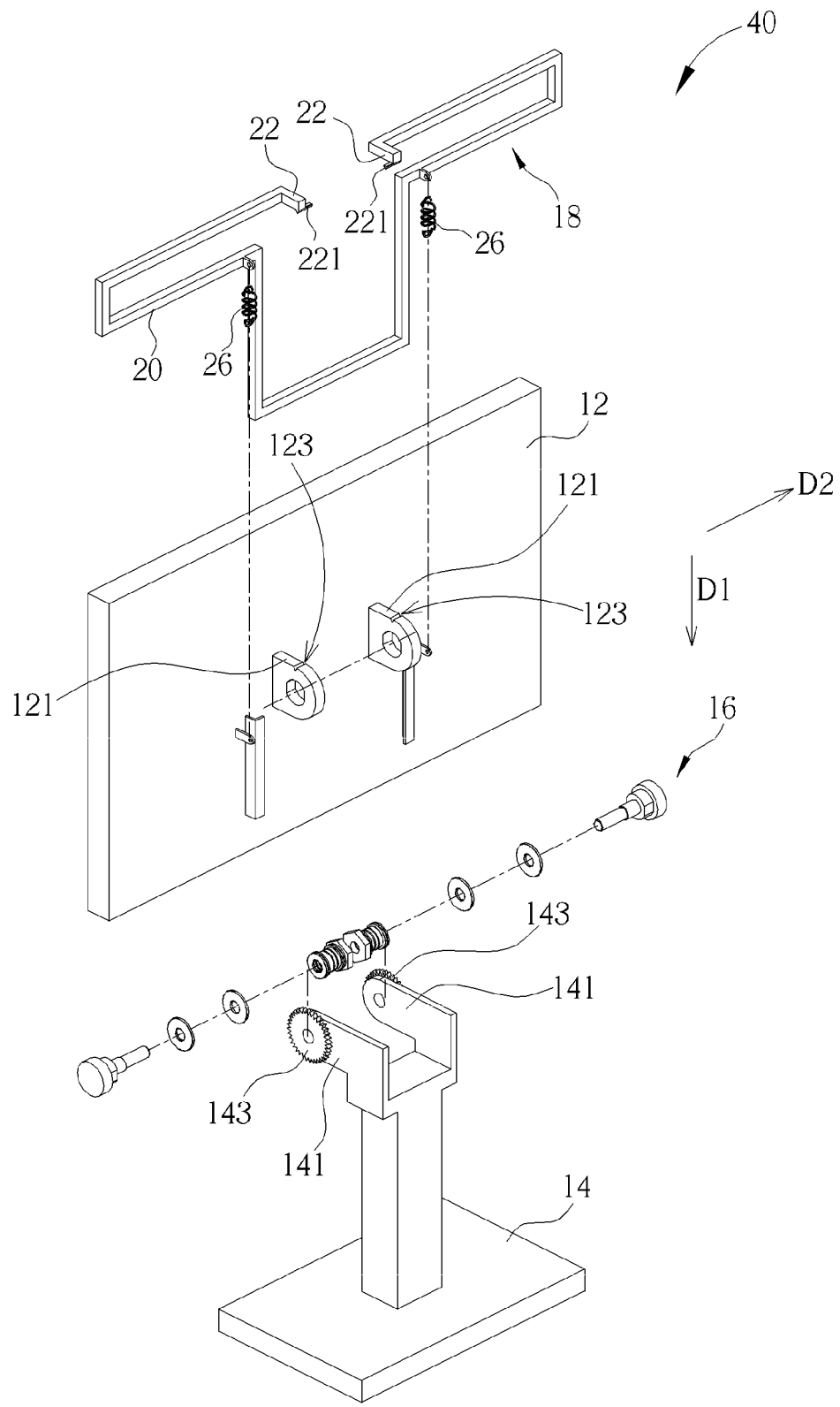
FIG. 5 is an exploded diagram of a display according to a third embodiment of the present invention.
Figure 6:
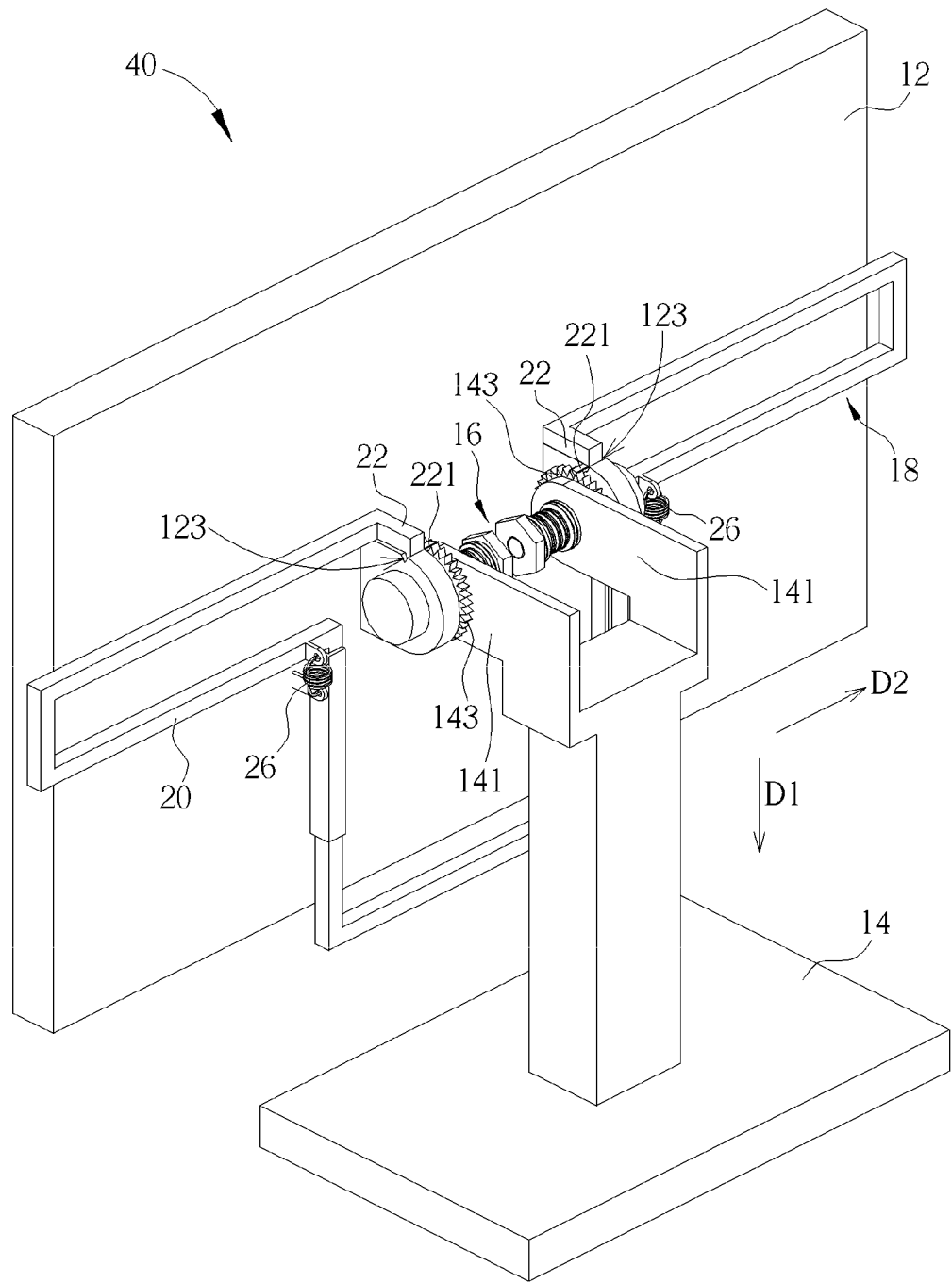
FIG. 6 and FIG. 7 respectively are diagrams of the display in different operating modes according to the third embodiment of the present invention.
Figure 7:
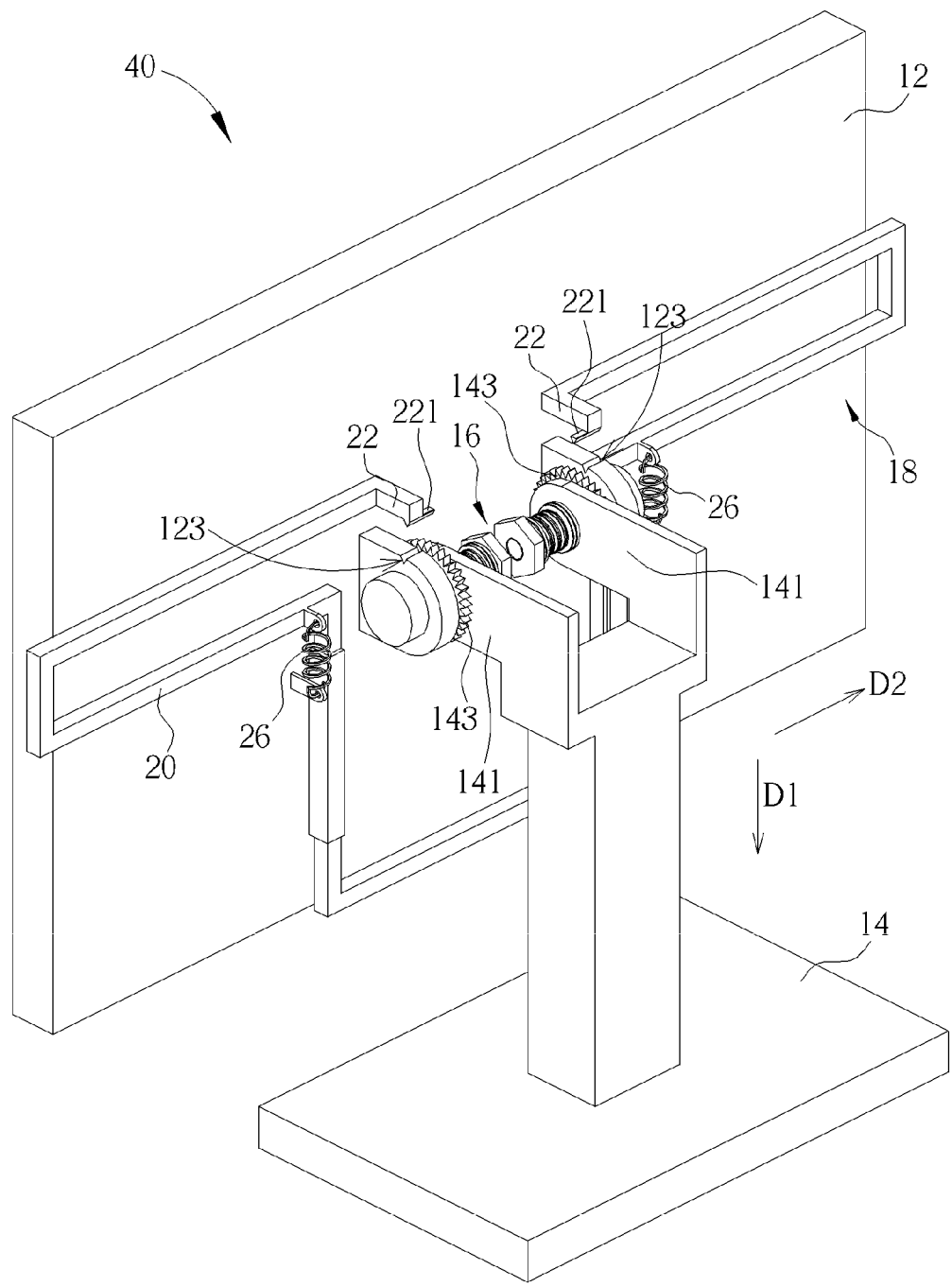

Please refer to FIG. 5 to FIG. 7. FIG. 5 is an exploded diagram of a display 40 according to a third embodiment of the present invention. FIG. 6 and FIG. 7 respectively are diagrams of the display 40 in different operating modes according to the third embodiment of the present invention. In the third embodiment, elements having the same numerals as ones of the above-mentioned embodiment have the same structures and functions, and detailed description is omitted herein for simplicity. Difference between the third embodiment and the above-mentioned embodiment is that the body 20 of the third embodiment can be slidably disposed on the panel 12, and the axial direction of the resilient component 26 can be substantially parallel to the first direction D1.

In addition, the body 20 can be designed as a T-shaped structure for operating convenience of the slide body 20, such as the T-shaped frame shown in FIG. 5. Two ends of the T-shaped structure can respectively protrude from two lateral edges of the panel 12 along a second direction D2 different from the first direction D1, and the protruding part of the T-shaped structure can be pressed to rotate the panel 12. Generally, the second direction D2 can be substantially perpendicular to the first direction D1. The first engaging portion 123, the second engaging portion 143 and the third engaging portion 221 can constrain the rotation of the panel 12 relative to the supporter 14 via the pivot mechanism 16 by the above-mentioned method, such as a structural engagement or an application of the static friction, and detailed description is omitted herein for simplicity.

The constraint mechanism 18 of the display 40 of the third embodiment utilizes the structural engagement to lock and to unlock the pivot mechanism 16. As the display 40 is at the initial state, the pivot mechanism 16 is locked by the constraint mechanism 18, and the panel 12 can not rotate relative to the supporter 14. For unlocking the constraint mechanism 18, the protruding part of the body 20 (the part protrudes from the right and the left boundary of the panel 12, or protrudes from the upper and the low boundary of the panel 12) can be pushed along a direction opposite to the first direction, so as to separate the third engaging portion 221 of the contacting portion 22 from the first engaging portion 123 and the second engaging portion 143. As shown in FIG. 7, the view angle of the panel 12 can be adjusted according to actual demand, and the resilient component 26 is extended to store the resilient recovering force. After the view angle of the panel 12 is determined, the external force applied to the body 20 is released, the resilient recovering force of the resilient component 26 slides the body 20 along the first direction D1, and the third engaging portion 221 of the contacting portion 22 backs to the initial state that is engaged with the first engaging portion 123 and the second engaging portion 143. Therefore, the view angle of the display 40 can be steady.

Figure 8:
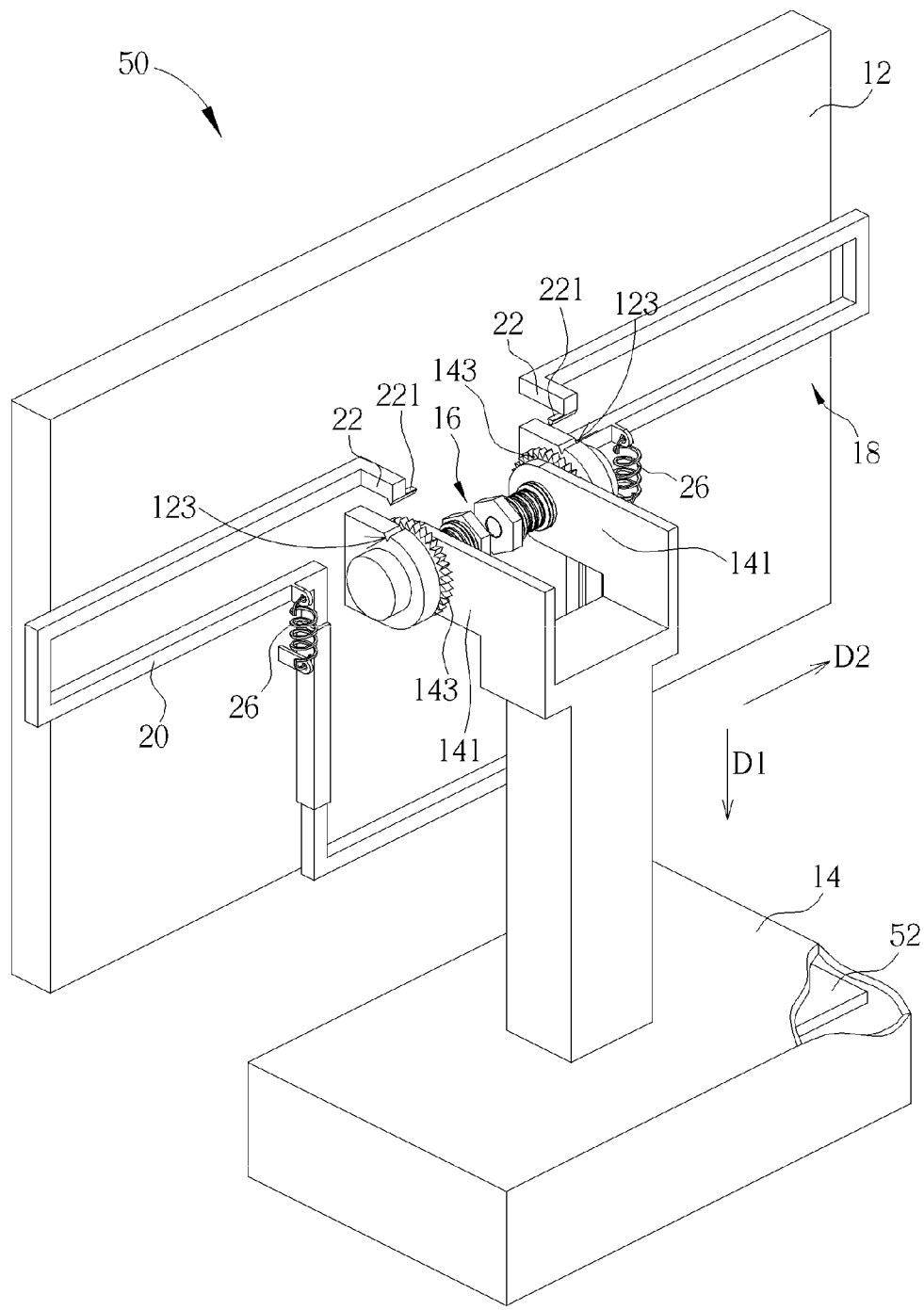
FIG. 8 is a diagram of an electronic device according to the other embodiment of the present invention.

Please refer to FIG. 8. FIG. 8 is a diagram of an electronic device 50 according to the other embodiment of the present invention. The electronic device 50 can be the All-in-one computer. In the embodiment, elements having the same numerals as ones of the above-mentioned embodiment have the same structures and functions, and detailed description is omitted herein for simplicity. Comparing to the display of the above-mentioned embodiment, the present invention can further apply to the All-in-one computer. The All-in-one computer (the electronic device 50) can dispose the electronic components 52, such as a processor, a memory, a hard disk and so on, inside the supporter 14. Generally, the panel 12 (the display screen) of the All-in-one computer has large scale, and the constraint mechanism 18 of the present invention can lock the pivot mechanism 16, so as to prevent the pivot mechanism 16 from ineffectiveness due to the weight of the panel 12. The view angle of the electronic device 50 can be adjusted and fixed easily. As the user clicks the touch screen (the panel 12) of the electronic device 50, the pivot mechanism 16 can not overcome a torque by itself (the torque is generated when the panel 12 is clicked), and the constraint mechanism 18 can provide a preferred locking effort to effectively steady the rotation of the panel 12 with the pivot mechanism 16.

In conclusion, the display of the present invention utilizes the body movably disposed on the panel to drive the contacting portion to contact the first bridging component and the second bridging component, so as to constrain the rotation of the panel relative to the supporter. The body of the constraint mechanism can be disposed on a back of the panel in a slidable manner or in a rotatable manner. As the constraint mechanism utilizes the rotatable body, the body can partly protrude from the low boundary of the panel due to the ergonomics. The user can press the body when pushing a low side of the panel to rotate relative to the supporter, so as to separate the contacting portion from the first bridging component and the second bridging component for unlocking the constraint mechanism. When the panel is rotated at the predetermined view angle, the external force applied to the panel and the body are released, the resilient component rotates the body in reverse, so that the contacting portion backs to contact the first bridging component and the second bridging component for locking the constraint mechanism.

As the constraint mechanism utilizes the slidable body, the body can partly protrude from the low boundary and the lateral edges of the panel due to the ergonomics, and the user can push the panel conveniently by the protruding part of the body when holding the panel. After the body slides relative to the panel, the contacting portion can be separated from the first bridging component and the second bridging component. The pivot mechanism is not constrained by the constraint mechanism, the view angle of the panel can be adjusted easily by rotating the panel relative to the supporter, and meantime the resilient component is extended to store the resilient recovering force. For locking the pivot mechanism, the external force applied to the panel is released, the resilient recovering force of the resilient component can slide the body in reverse, and the contacting portion backs to contact the first bridging component and the second bridging component, so the constraint mechanism is started for steadying the view angle of the panel.

The constraint mechanism does not include the resilient component when the contacting portion is designed to contact upper positions of the first bridging component and the second bridging component. The body can utilize its weight to move from a first position (that is separated from the first bridging component and the second bridging component) to a second position (that contacts the first bridging component and the second bridging component) when the external force is released. The contacting portion not only can contact the upper positions of the first bridging component and the second bridging component, but also can contact low positions or lateral positions of the first bridging component and the second bridging component. Structural disposition capable of simultaneously contacting the first bridging component and the second bridging component for constraining its relative rotation belongs to the design scope of the constraint mechanism of the present invention, and detailed description is omitted herein for simplicity.

Comparing to the prior art, the display of the present invention utilizes the constraint mechanism to unlock the pivot mechanism, so as to steady the view angle of the panel relative to the supporter. The constraint mechanism of the present invention is actuated with the adjustment of the view angle of the panel, so as to decrease operation steps for economizing adjustment period of the display effectively. It is to say, the present invention can be preferably applied to the large-scaled display. The large-scaled display includes the pivot mechanism with necessary torque, and the constraint mechanism for constraining the pivot mechanism accordingly. When adjusting the view angle of the display, the constraint mechanism can be unlocked, and the panel can be rotated via the pivot mechanism simultaneously. After the external force applied to the panel is released, the constraint mechanism can lock the pivot mechanism immediately. Therefore, the present invention can actuate the pivot mechanism and the constraint mechanism of the display without extra steps (such as independent steps to lock and to unlock the pivot mechanism by the constraint mechanism), and provides convenient adjustment and effective immovability for the panel.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A display comprising:
a panel, the panel comprising a first bridging component;
a supporter, the supporter comprising a second bridging component;
a pivot mechanism disposed between the first bridging component and the second bridging component, a rotation angle of the panel relative to the supporter being adjusted via the pivot mechanism; and
a constraint mechanism for constraining rotation of the panel relative to the supporter, the constraint mechanism comprising:
a body movably disposed on a position of the panel adjacent to the pivot mechanism, the body partly protruding from a boundary of the panel along a first direction; and
a contacting portion connected to the body, the contacting portion contacting the first bridging component and the second bridging component, so as to constrain rotation of the first bridging component relative to the second bridging component.

2. The display of claim 1, wherein the body partly protrudes from a low boundary of the panel along the first direction.

3. The display of claim 1, wherein the body is a T-shaped structure, two ends of the T-shaped structure respectively protrude from two lateral edges of the panel along a second direction different from the first direction.

4. The display of claim 1, wherein the constraint mechanism further comprises a plurality of friction gaskets disposed on the contacting portion for contacting surfaces of the first bridging component and the second bridging component.

5. The display of claim 1, wherein the first bridging component comprises a first engaging portion, the second bridging component comprises a second engaging portion, the contacting portion comprises a third engaging portion, the third engaging portion is engaged with the first engaging portion and the second engaging portion simultaneously, so as to constrain the rotation between the first bridging component and the second bridging component.

6. The display of claim 5, wherein the first engaging portion is a sunken structure, the second engaging portion is a dentate structure, the third engaging portion is a protrusion, and the protrusion is engaged inside the sunken structure and a groove of the dentate structure.

7. The display of claim 5, wherein the first engaging portion is a protrusion, the second engaging portion is a dentate structure, the third engaging portion is a sunken structure, and the sunken structure is engaged with the protrusion and a rack of the dentate structure.

8. The display of claim 1, wherein the constraint mechanism further comprises a resilient component, two ends of the resilient component are respectively connected to the body and the panel, so as to drive the contacting portion to contact the first bridging component and the second bridging component.

9. The display of claim 8, wherein an axial direction of the resilient component is substantially parallel to the first direction.

10. The display of claim 9, wherein the body is slidably disposed on the panel.

11. The display of claim 8, wherein an axial direction of the resilient component is substantially parallel to a plane normal vector of the panel.

12. The display of claim 11, wherein the body is rotatably disposed on the panel.

13. The display of claim 8, wherein the resilient component is an extended spring.

14. The display of claim 1, wherein the panel is a display screen or a board holder.

15. An electronic device comprising:
a panel, the panel comprising a first bridging component;
a supporter, the supporter comprising a second bridging component, at least one electronic component being disposed inside the supporter;
a pivot mechanism disposed between the first bridging component and the second bridging component, a rotation angle of the panel relative to the supporter being adjusted via the pivot mechanism; and
a constraint mechanism for constraining rotation of the panel relative to the supporter, the constraint mechanism comprising:
a body movably disposed on a position of the panel adjacent to the pivot mechanism, the body partly protruding from a boundary of the panel along a first direction; and
a contacting portion connected to the body, the contacting portion contacting the first bridging component and the second bridging component, so as to constrain rotation of the first bridging component relative to the second bridging component.

16. The electronic device of claim 15, wherein the body is a T-shaped structure, two ends of the T-shaped structure respectively protrude from two lateral edges of the panel along a second direction different from the first direction.

17. The electronic device of claim 15, wherein the first bridging component comprises a first engaging portion, the second bridging component comprises a second engaging portion, the contacting portion comprises a third engaging portion, the third engaging portion is engaged with the first engaging portion and the second engaging portion simultaneously, so as to constrain the rotation between the first bridging component and the second bridging component.

18. The electronic device of claim 15, wherein the constraint mechanism further comprises a resilient component, two ends of the resilient component are respectively connected to the body and the panel, so as to drive the contacting portion to contact the first bridging component and the second bridging component.

19. The electronic device of claim 18, wherein an axial direction of the resilient component is substantially parallel to the first direction, or substantially parallel to a plane normal vector of the panel.

20. The electronic device of claim 15, wherein the body is slidably disposed on the panel, or is rotatably disposed on the panel.

* * * * *